US012356158B2

(12) United States Patent
Morgan et al.

(10) Patent No.: US 12,356,158 B2
(45) Date of Patent: Jul. 8, 2025

(54) CLIPPING PREVENTION IN SWITCHED MODE DRIVERS

(71) Applicant: Cirrus Logic International Semiconductor Ltd., Edinburgh (GB)

(72) Inventors: Ross C. Morgan, Edinburgh (GB); Roberto Napoli, Milan (IT); Kemal S. Demirci, Dallas, TX (US); Thomas H. Hoff, Austin, TX (US)

(73) Assignee: Cirrus Logic Inc., Austin, TX (US)

( * ) Notice: Subject to any disclaimer, the term of this patent is extended or adjusted under 35 U.S.C. 154(b) by 241 days.

(21) Appl. No.: 18/188,085

(22) Filed: Mar. 22, 2023

(65) Prior Publication Data

US 2024/0323601 A1    Sep. 26, 2024

(51) Int. Cl.
*G05F 1/625* (2006.01)
*H04R 3/00* (2006.01)
*H04R 29/00* (2006.01)

(52) U.S. Cl.
CPC ........... *H04R 3/007* (2013.01); *H04R 29/001* (2013.01); *H04R 2430/01* (2013.01)

(58) Field of Classification Search
CPC ... H04R 3/007; H04R 29/001; H04R 2430/01
USPC .............................. 381/59, 116, 120
See application file for complete search history.

(56) References Cited

U.S. PATENT DOCUMENTS

| | | | | |
|---|---|---|---|---|
| 4,912,393 A * | 3/1990 | Anderson | .................. | H03F 1/56 327/542 |
| 7,808,324 B1 * | 10/2010 | Woodford | .................. | H03F 3/21 330/296 |
| 8,036,402 B2 * | 10/2011 | Furge | .................. | H03G 11/008 330/135 |
| 2007/0103234 A1 * | 5/2007 | Maejima | .................. | H03F 3/217 330/207 A |
| 2007/0140513 A1 * | 6/2007 | Furge | .................. | H03G 3/007 381/120 |
| 2012/0008796 A1 | 1/2012 | Furge | | |
| 2012/0154044 A1 * | 6/2012 | Hirano | .................. | H03F 3/217 330/251 |
| 2016/0126899 A1 * | 5/2016 | Doy | .................. | H03F 3/183 330/297 |
| 2022/0229457 A1 | 7/2022 | Palit et al. | | |

(Continued)

OTHER PUBLICATIONS

Combined Search and Examination Report under Sections 17 and 18(3), UKIPO, Application No. GB2400276.8, mailed Dec. 18, 2024.

*Primary Examiner* — William J Deane, Jr.
(74) *Attorney, Agent, or Firm* — Jackson Walker L.L.P.

(57) ABSTRACT

This application relates to methods and apparatus for clipping prevention. A driver apparatus for driving a transducer has a switching driver configured to switch at least one output node between different switching voltages with a controlled duty-cycle to drive an output signal across the transducer. A clipping prevention controller is configured to control a gain applied to the input signal so as to provide limiting of the input signal to avoid clipping of the output signal. The clipping prevention controller is configured to dynamically control at least one limiting threshold used to determine when to apply limiting of the input signal based on an indication of load resistance of the transducer and the input voltage to the switching driver.

20 Claims, 4 Drawing Sheets

(56) References Cited

U.S. PATENT DOCUMENTS

2022/0376618 A1 11/2022 Cheng et al.
2023/0102992 A1* 3/2023 Peting .................... H03F 1/523
330/251

* cited by examiner

CLIPPING PREVENTION IN SWITCHED MODE DRIVERS

TECHNICAL FIELD

The field of representative embodiments of this disclosure relates to methods, apparatus and/or implementations concerning or relating to voltage limiting for driver circuits, and in particular to voltage limiting for switched mode driver circuits or switching drivers as may be used to drive a transducer.

BACKGROUND

Many electronic devices include transducer driver circuitry for driving a transducer with a suitable driving signal, for instance for driving an audio output transducer of the host device or a connected accessory, with an audio driving signal.

In some applications the driver circuitry may include a switching driver, e.g. a class-D amplifier output stage or the like, for generating the drive signal. Switching drivers, sometimes referred to as switched-mode drivers or switched-mode amplifiers, can be relatively power efficient and thus can be advantageously used in some applications. A switching driver generally operates to switch an output node between different switching voltages, with a duty cycle that provides a desired average output voltage over the course of the duty cycle for the drive signal.

In at least some implementations, the transducer driving circuitry may comprise some clipping prevention control, to avoid unwanted signal clipping, i.e. to avoid distortion in the output signal due to the output stage being unable to provide or maintain the output voltage demand.

In some cases, a switching voltage for the switching driver may be generated from an input supply, e.g. from a battery voltage, using an inductive DC-DC converter, e.g. such as a boost converter. In such cases, the DC-DC converter will generally be current-controlled and therefore clipping prevention can be implemented by the use of input current limiting, which can also provide limiting of a maximum current draw from battery and current protection of the boost inductor and associated circuitry.

However, in some cases, for instance where one or more switching voltages for the switching driver may be generated by capacitive boosting, e.g. using a charge pump or similar, the use of current limiting to prevent output voltage clipping may not be appropriate, as the efficiency of the switching driver and limits applied on input battery current draw may mean that voltage clipping could occur before a relevant current limit is reached.

In such cases, clipping prevention may be implemented by reactively monitoring the input supply voltage and determining signal levels at which to apply signal attenuation to avoid clipping, but such approaches may generally require relatively significant margining to allow for the worst-case possible operating conditions, with result that signal limiting may be applied in cases where it not actually required, with a consequent negative impact on performance.

SUMMARY

Embodiments of the present disclosure relate to method and apparatus for clipping prevention that at least mitigate at least some of the above-mentioned issues.

According to an aspect of the disclosure there is provided a driver apparatus for driving a transducer based on an input signal comprising a switching driver comprising first and second input nodes for receiving first and second supply voltages defining an input voltage and first and second output nodes for connection to the transducer. The switching driver is configured to switch one or both of the first and second output nodes between different switching voltages with a controlled duty-cycle to drive an output signal across the transducer. A clipping prevention controller is configured to control a gain applied to the input signal so as to provide limiting of the input signal to avoid clipping of the output signal, wherein the clipping prevention controller is configured to dynamically control at least one limiting threshold used to determine when to apply limiting of the input signal based on an indication of load resistance of the transducer and the input voltage to the switching driver.

In some implementations the driver apparatus may comprise at least one capacitive voltage generator for generating an additional voltage, the switching driver being configured, in at least one mode of operation, to use the additional voltage as a switching voltage.

The switching driver may comprise a switch network and a modulator, the modulator being configured to receive the input signal and control the switch network so as to switch said one or both of the first and second output nodes between different switching voltages with a controlled duty-cycle. The modulator may comprise a quantizer controller configured to receive a quantizer input signal based on the input signal and to output switch control signals for controlling the duty-cycle of one or more switches of the switch network. The clipping prevention controller may comprise a limiter configured to determine a maximum voltage value, corresponding to a maximum output voltage for the switching driver, based on the indication of input voltage and the indication of load resistance of the transducer, and also based on first and second values corresponding to a value of quantizer input signal and a value of output resistance of the switching driver respectively which collectively maximise the output voltage, wherein the limiter is configured to control the at least one limiting threshold based on said maximum voltage value. In some examples, the clipping prevention controller may comprise a determination block configured to determine the first and second determined values based on a set of variables, wherein the set of variables comprises at least one of: temperature of the switching driver; calibration values for components of the switching driver; input signal level; the indication of load resistance; a signal level of a signal in another channel of the driver apparatus for driving a different transducer. The determination block may comprise a memory storing predetermined first and second values for each of a plurality of different possible combinations of values of the set of variables, and wherein the determination block is configured to receive or determine values of the set of variables and identify an appropriate one of the predetermined first and second values. In some examples, the clipping prevention controller may further comprise an output-resistance-and-quantizer-input monitor configured to determine a monitored value of output resistance of the switching driver and determine a monitored value of the magnitude of quantizer input signal. The determination block may be configured, in the event of occurrence of signal clipping, to adjust the predetermined first and second values based on the monitored value of output resistance and monitored value of the quantizer input signal. In some examples, the modulator is configured such that the quantizer input signal is a digital signal.

In some examples, the clipping prevention controller may comprise an input voltage predictor for providing a prediction of input voltage and the clipping prevention controller is configured to use the prediction of input voltage as said indication of input voltage. The voltage predictor may be configured to receive, and predict the input voltage from, a measurement of the input voltage, an indication of output current from the switching driver to the transducer, and an indication of output voltage across the transducer.

In some examples, the clipping prevention controller may comprise a load resistance predictor for providing a prediction of load resistance and the clipping prevention controller may be configured to use the prediction of load resistance as said indication of load resistance. The load resistance predictor may be configured to receive, and predict the load resistance from, an indication of output current from the switching driver to the transducer and an indication of output voltage across the transducer.

In some examples, the clipping prevention controller may comprise a load resistance monitor configured to determine a DC resistance of the transducer based on an indication of output current from the switching driver to the transducer and an indication of output voltage across the transducer and the clipping prevention controller may be configured to use the determined DC resistance of the transducer as said indication of load resistance.

In some examples the clipping prevention controller may comprise a store of predetermined threshold limits for possible values of determined DC resistance and input voltage. In some examples the at least one limiting threshold may be a threshold for a compressor in a signal path for the input signal upstream of the switching driver. The at least one limiting threshold may comprise a soft limit threshold and a hard limit threshold, and the compressor may be configured to start to apply compression to the input signal at the soft limit threshold and may be configured to apply compression so that the input signal, after compression, does not exceed the hard limit threshold.

In some examples, the switching driver may be configured to be operable in a plurality of operating modes, wherein the switching voltages are different in the different modes.

In another aspect there is provided a driver apparatus for driving a load based on an input signal comprising: a switching driver; and a clipping prevention controller configured to control a gain applied to the input signal so as to provide limiting of the input signal to avoid clipping of the output signal, wherein the clipping prevention controller is configured to dynamically control at least one limiting threshold used to determine when to apply limiting of the input signal based on each of: an indication of load resistance of the transducer; an indication of an input voltage to the switching driver; and a set of one or more variables that affect efficiency of the switching driver. The indication of load resistance may, in some examples, be a prediction of load resistance determined by a load resistance predictor and the indication of input voltage is a prediction of input voltage determined by an input voltage predictor.

In another aspect there is provided a driver apparatus for driving a load based on an input signal comprising: a switching driver; and a clipping prevention controller configured to dynamically control at least one limiting threshold used to determine when to apply limiting of the input signal based on a prediction of load resistance of the transducer and a prediction of an input voltage to the switching driver.

In another aspect there is provided a driver apparatus for driving a transducer with an output signal based on an input signal comprising: a switching driver comprising: first and second input nodes for receiving first and second supply voltages defining an input voltage; first and second output nodes for connection to the transducer; a switch network; and a modulator configured to receive the input signal and a feedback signal indicative of the output signal and control the switch network so as to switch said one or both of the first and second output nodes between different switching voltages with a controlled duty-cycle, wherein the modulator comprises a quantizer controller configured to receive a quantizer input signal based on the input signal and the feedback signal and to output switch control signals for controlling the duty-cycle of one or more switches of the switch network; wherein the driver apparatus further comprising a clipping prevention controller configured to control a gain applied to the input signal so as to provide limiting of the input signal to avoid clipping of the output signal, wherein the clipping prevention controller is configured to dynamically control at least one limiting threshold used to determine when to apply limiting of the input signal based on an indication of said quantizer input signal.

In another aspect there is provided a driver apparatus for driving a load with an output signal based on an input signal comprising: a switching driver comprising a quantizer controller for generating one or more switch control signals for controlling a duty-cycle of switching of at least one output node of the switching driver between different switching voltages, wherein the quantizer controller receives a quantizer input signal based on the input signal and a feedback signal of the output signal; and a clipping prevention controller configured to dynamically control at least one limiting threshold used to determine when to apply limiting of the input signal based on the quantizer input signal.

In another aspect there is provided a driver apparatus for driving a load based on an input signal comprising: a closed-loop switching driver; and a clipping prevention controller configured to dynamically control at least one limiting threshold used to determine when to apply limiting of the input signal based on a difference between an input to a quantizer of the closed-loop switching driver and a predetermined quantizer input limit.

It should be noted that, unless expressly indicated to the contrary herein or otherwise clearly incompatible, then any feature described herein may be implemented in combination with any one or more other described features.

BRIEF DESCRIPTION OF DRAWINGS

For a better understanding of examples of the present disclosure, and to show more clearly how the examples may be carried into effect, reference will now be made, by way of example only, to the following drawings in which.

DESCRIPTION OF EMBODIMENTS

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiments discussed below, and all such equivalents should be deemed as being encompassed by the present disclosure.

Embodiments of the disclosure relate to clipping prevention for switching drivers, e.g. switched mode amplifiers such as class-D amplifiers or the like, and in particular for switching drivers operable with capacitive voltage boosting.

Figure 1:
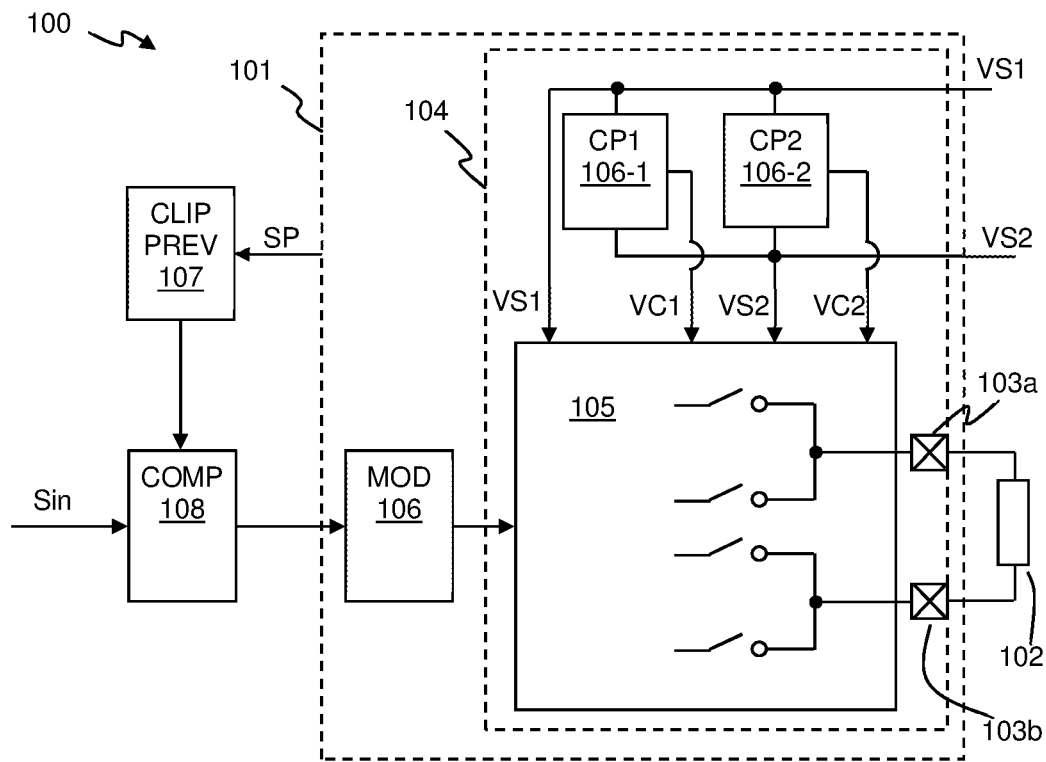
FIG. 1 illustrates one example of a switching driver apparatus with clipping prevention.

FIG. 1 illustrates one example of a driver apparatus 100 having a switching driver 101 for driving a transducer load 102 based on an input signal Sin. In some applications the transducer load 102 could be an acoustic output transducer, such as a loudspeaker of a host device of the driver apparatus or a speaker of an accessory device which may, in use, be removably connected to the host device, although in other applications the driver apparatus may be used to driver other transducers, e.g. haptic output transducers such as linear resonant actuators or the like. In the example of FIG. 1, the switching driver 101 is configured to be operable to drive the load in a bridge-tied-load (BTL) configuration, and thus the load transducer 102 is connected, in use, between respective output nodes 103a and 103b of the switching driver 101 such that each side of the load can be driven with a respective drive signal based on the input signal Sin so as to generate a desired differential output signal across the load transducer 102. In some cases, however, the switching driver 101 could be configured to drive the load transducer 102 a single-ended fashion, where only one side of the load is driven with a drive signal based on the input signal Sin and the other side of the load transducer 102 is held at a fixed DC voltage.

A stage 104 of the switching driver 101, which will be referred to herein as a power stage, comprises a switch network 105 of switching paths that can be controlled so as to switch the output nodes 103a and 103b between different switching voltages. It will be understood that FIG. 1 generally illustrates just some switches of a possible switch network 105 and that there are various different arrangements of switches that could be implemented, depending on the application. For example, U.S. Pat. No. 11,277,128 and US2022/0376618 describe examples of switched mode drivers. A modulator 106 controls the operation of the switch network 105 so as to modulate each of the output nodes 103a and 103b between the relevant switching voltages with a controlled duty cycle so as to generate the respective driver signal for that output node based on the input signal Sin.

The switching driver 101 has first and second input nodes for receiving first and second supply voltages, VS1 and VS2, which may, for example, be a positive supply voltage and ground. For the avoidance of doubt, as used in this disclosure, the term supply voltage can include a ground voltage, i.e. 0 V (zero volts) and references to receiving a supply voltage will cover receiving a defined ground voltage. The first and second supply voltages VS1 and VS2 define an input voltage Vin (as the difference between the first and second supply voltages VS1 and VS2, e.g. Vin=VS1−VS2).

In at least some embodiments of the present disclosure, the power stage 104 of the switching driver 101 also comprises at least one capacitive voltage generator for generating an additional voltage, which is different to the first and second supply voltages VS1 and VS2, and which can, in at least one operating mode of the switching driver, be used as a switching voltage by the switching driver, i.e. by the power stage 104.

A capacitive voltage generator receives input voltages, such as the first and second supply voltages VS1 and VS2 (and/or, in some cases, a voltage output from another capacitive voltage generator), and is operable so that at least one flying capacitor (not separately illustrated in FIG. 1) can be connected, in a charging state, to be charged by the input voltages for that capacitive voltage generator, and can then be connected, in an output state, with one of the input voltages to provide an output voltage which is level shifted from that input voltage.

In the example of FIG. 1, a first capacitive voltage generator 106-1 receives the first and second supply voltages and generates an output voltage VC1, which may, for example, correspond to the first supply voltage VS1 positively boosted by an amount equal the input voltage Vin, and a second capacitive voltage generator 106-2 receives the first and second supply voltages and generates an output voltage VC2, which may for example correspond to the second supply voltage VS1 negatively boosted by an amount equal to the input voltage Vin. In some cases, at least one of the capacitive voltage generators 106 may comprise a charge pump which operates, in use, with at least one hold or reservoir capacitor (not separately illustrated) at the output of the charge pump to maintain the output voltage of the charge pump. In such a case, the output voltage of the charge pump may be maintained in a substantially constant manner when the charge pump is active, with only a certain voltage ripple due to the switching cycle of the charge pump—and the switching cycle of the charge pump may be independent of the switching cycle of the modulation of the output nodes 103a and 103b. In some cases, however, the capacitive voltage generator may not operate with a hold capacitor and may generate the relevant output voltage for only part of the switching cycle as required for modulation of the output nodes.

In the example of FIG. 1, the switching driver 101 is a multi-level switching driver which is operable so that switching voltages which the output nodes 103a and 103b are switched between can be selectively varied in use. The switching voltages may be selected from the first and second supply voltages VS1 or VS2 and the generated voltages VC1 and VC2.

Purely by way of example, consider that the first supply voltage VS1 is a positive supply voltage, VP, and the second supply voltage is ground, i.e. 0 V, and the input supply voltage, Vin, defined by the difference between VS1 and VS2, is thus equal to VP. If the output voltage VC1 of the first capacitive voltage generator 106-1 is equal to the first supply voltage positively boosted by the input voltage, the output voltage from the first capacitive voltage generator 106-1 will be equal to 2VP. If the output voltage VC2 of the second capacitive voltage generator 106-2 is equal to the second supply voltage negatively boosted by the input voltage, the output voltage from the second capacitive voltage generator 106-2 will be equal to −VP. In this example, the switching voltages can thus be selected from any of +2VP, VP, 0 V or −VP.

The switching driver 101 may be operable in a variety of different operating modes where the switching voltages are different in the different mode. For example, the switching driver 101 could be operated in a first mode, which can be seen as a low signal level mode, in which both output nodes 103a and 103b are modulated between the first and second supply voltages, VP and ground, to generate a differential output signal, of either polarity, with a magnitude of up to VP (on average over the course of the switching cycle). The switching driver 101 could also be operated in a second mode, which can be seen as an intermediate signal level mode, in which a one of the driver output nodes 103a or 103b (depending on the required polarity of the output signal) is modulated between the boosted voltage +2VP and the first supply voltage VP, whilst the other driver output node is modulated between the first and second supply voltages, VP and ground, to generate a differential output signal across the load of a magnitude up to 2VP. In an alternative second mode, the same output range could be generated by instead switching one driver output node between the first and second supply voltages VP and ground, whilst switching the other output node between ground and the boosted voltage-VP. A third mode, which can be seen as a high signal level mode, may involve one driver output node (depending on the required polarity of the output signal) being modulated between the boosted voltage +2VP and the first supply voltage VP, whilst the other driver output node is modulated between the ground and the boosted voltage-VP, to generate a differential output signal across the load of a magnitude up to 3VP.

The switching voltages are different in the different modes, in that at least one of the switching voltages for at least one of the driver output nodes is different in each different mode. It will be understood that some switching voltages for the driver output nodes may be the same in different modes, e.g. the first and second modes in the example above both use VP and ground as switching voltages for one driver output node, however the other node is switched between VP and ground in the first mode and between 2VP and VP in the second mode. As used herein, a reference to different modes using different switching voltages shall thus mean that the set of switching voltages used in the different modes is not the same, but there may be some switching voltages in common in some cases.

It should be noted that whilst the capacitive voltage generator(s) may be used for voltage boosting or step-up operation, i.e. to provide level shifting of a voltage to provide a voltage of a higher magnitude (whether positive boosting or negative boosting), in some applications at least one capacitive voltage generator may be configured to provide a voltage of a lower magnitude, e.g. to provide a buck or step-down operation which may provide a voltage with a magnitude which is a fraction of that of the input voltage.

The modulator 106 is thus configured to control the mode of operation of the power stage 104 of the switching driver and also a duty cycle of modulation of the driver output nodes in the relevant mode, which in some cases may involve control over at least one of the capacitive voltage generators 106, e.g. to enable or disable the capacitive voltage generator and/or control a duty-cycle or switching frequency.

Typically the duty cycles for the output nodes are determined by a suitable quantizer or similar controller of the modulator 106. In some cases, the input signal Sin received by the modulator 106 may simply be supplied as an input signal Smod for a quantizer, but in some implementations there may be at least some filtering applied to provide a quantizer input signal Smod. In closed-loop operation of the switching driver 101, a feedback signal may be combined with the input signal, with some filtering, to provide the quantizer input signal Smod.

Figure 2:
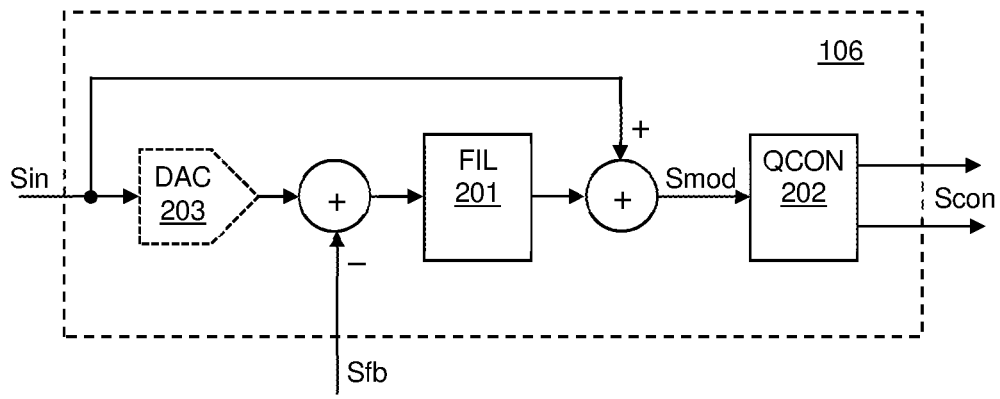
FIG. 2 illustrates one example of a modulator for a switching driver.

FIG. 2 illustrates one example of a modulator 106, which in this example may be operable in a closed-loop manner. The input signal Sin received by the modulator 106 is combined with a feedback signal Sfb, e.g. by subtraction to form an error signal, and then filtered by a loop filter 201. The feedback signal Sfb may, in at least some implementations, be a feedback signal indicative of the output voltage Vout across the load transducer 102. In some implementations, the filtered output of the loop filter 201 may be combined with a feedforward version of the input signal Sin to provide the signal Smod for input to a quantizer controller 202. The quantizer controller 202 may be configured, for a multi-level switching driver 101 such as discussed with reference to FIG. 1, to determine the relevant mode of operation and to control the switch network 105 and capacitive voltage generators 106 accordingly, including generating suitable switch control signals, e.g. suitable PWM signals, to control the duty-cycles of the relevant switches to modulate the output nodes between the relevant switching voltages with the required duty-cycle. For example, the quantizer controller 202 may compare the quantizer input signal Smod to one or more thresholds to determine an operating mode and, for the relevant mode, compare the compare the quantizer input signal Smod to at least one appropriate ramp waveform to generate the suitable PWM switch control signals for the relevant switches that are duty-cycled in that mode.

In some cases, the feedback signal Sfb may be received as a digital signal, e.g. from an analog-to-digital converter (ADC) in the feedback path, and thus the feedback signal may be combined digitally with the input signal and the loop filter 201 may be a digital filter. In some cases, however, the feedback signal may be an analog feedback signal and thus may be combined with an analog version input signal Sin. The modulator may thus comprise a digital-to-analogue converter DAC 203 for converting the input signal to analog. In some cases the loop filter 201 could be an analog filter and the output of the loop filter could be combined with a feedforward version of the analog input signal so as to provide an analog quantizer input signal Smod for the quantizer controller 202. In some cases however, as illustrated in FIG. 2, the filter 201 may be a hybrid filter that receives an analog input and provides a digital output. This allows the digital input signal Sin to be fed forward and combined digitally with the output of the loop filter 201, which provides a digital quantizer input signal Smod to the quantizer/controller 202, which can be advantageous for some of the embodiments discussed below.

In any event, the quantizer input signal Smod may effectively encode the voltage demand of the power stage 104 of the switching driver 101—from which the quantizer controller 202 determines the mode of operation for a multi-level converter and the relevant duty-cycle.

Referring back to FIG. 1, the driver apparatus 100 also comprises a clipping prevention controller 107 for preventing unwanted clipping of the output signal from the switching driver 101. The clipping prevention controller 107 receives an indication SP of one or more parameters of the switching driver 101, as will be discussed in more detail below, and controls at least one gain applied to the input signal so as to prevent or limit any clipping. In the example of FIG. 1 the clipping prevention controller 107 controls operation of a compressor 108 which applies compression to the input signal Sin upstream of the switching driver 101 when required so as to prevent clipping. A compressor, as will be understood by one skilled in the art, may apply selective gain control so that different signal components, e.g. different frequencies, may be subject to different gains. This can limit signal peaks whilst minimising impact on the overall signal. The clipping prevention controller 107 may thus act to control a gain applied to at least part of the input signal so as to reduce signal peaks that otherwise could cause clipping, e.g. by reducing the amount of any positive amplification or increasing an amount of attenuation. The input signal for the switching driver 101, i.e. the input signal received by modulator 106, is thus the signal output from the compressor 108 which thus may be a gain adjusted version of the input signal.

For a switching driver 101 such as discussed with reference to FIG. 1, the output voltage Vout, i.e. the differential voltage across the load transducer 102 over the course of a switching cycle, clearly depends on the switching voltages which the output nodes switch between and also the relevant duty cycles. The switching voltages which the output nodes switch between are defined by, or generated from, the input supply voltage Vin and thus there is a dependence of the output voltage Vout on the input supply voltage Vin.

The duty-cycles of the output nodes are, as discussed with reference to FIG. 2, determined by the quantizer controller 202 based on the quantizer input signal Smod. The quantizer input signal Smod effectively encodes the voltage demand of the switching driver 101, from which the quantizer/controller 202 determines the mode of operation for a multi-level converter and the relevant duty-cycle.

For the example discussed above, where the supply voltages VS1 and VS2 are VP and ground respectively, so that the input supply voltage Vin=VP, and boosted voltages of +2VP and −VP are generated with the power stage being operable in three different modes to generate an output in the range of +3VP to −3VP, the output voltage will be proportional to the product of Vin=VP and Smod (where Smod has a value in the range of +3 to −3). However, the effective output resistance Rout of the power stage 104 and the load resistance Rload also impact on the actual voltage output and so the output voltage Vout can be given by:

$$Vout = (Smod \cdot Vin)/(Rout/Rload + 1) \qquad \text{Eqn. 1}$$

It can thus be seen that a maximum value of the output voltage Vout, for a maximum value of the modulator signal Smod, depends on a number of factors including the input voltage Vin (i.e. the supply voltage VP in this example), the load resistance Rload and the effective output resistance Rout of the power stage 104 of the switching driver 101. These parameters can vary in use meaning that the maximum output voltage achievable from the power stage can also vary in use, depending on various operating conditions. To avoid clipping, the clipping prevention controller 107 aims to control a gain applied to the input signal Sin, so that the voltage demand, based on the gain adjusted input signal output from the compressor 108 (plus any required headroom), does not exceed the maximum achievable output voltage. In particular the clipping prevention controller 107 dynamically controls at least one limiting threshold used to determine when to vary a gain to apply limiting of the input signal.

In some embodiments of the present disclosure, the clipping prevention controller 107 is configured to take the load resistance Rload into account in setting at least one limiting threshold used to determine when to apply limiting to prevent clipping. Whilst a default value of load resistance Rload could be used, as noted above, in practice the load resistance can vary in use, e.g. with temperature, and thus using a default value may result in over-limiting at times. In some embodiments, the clipping prevention controller may also be configured to take the input voltage Vin (VP in the example above) into account. In many implementations of a switching driver, the DC load resistance and the input voltage Vin may be the variables that have the greatest impact on the achievable maximum voltage output of the switching driver 101 and thus taking these variables into account to dynamically adjust one or more limits used for limiting the input signal can offer improve performance of the clipping prevention controller 107 in avoiding over-limiting.

Figure 3:
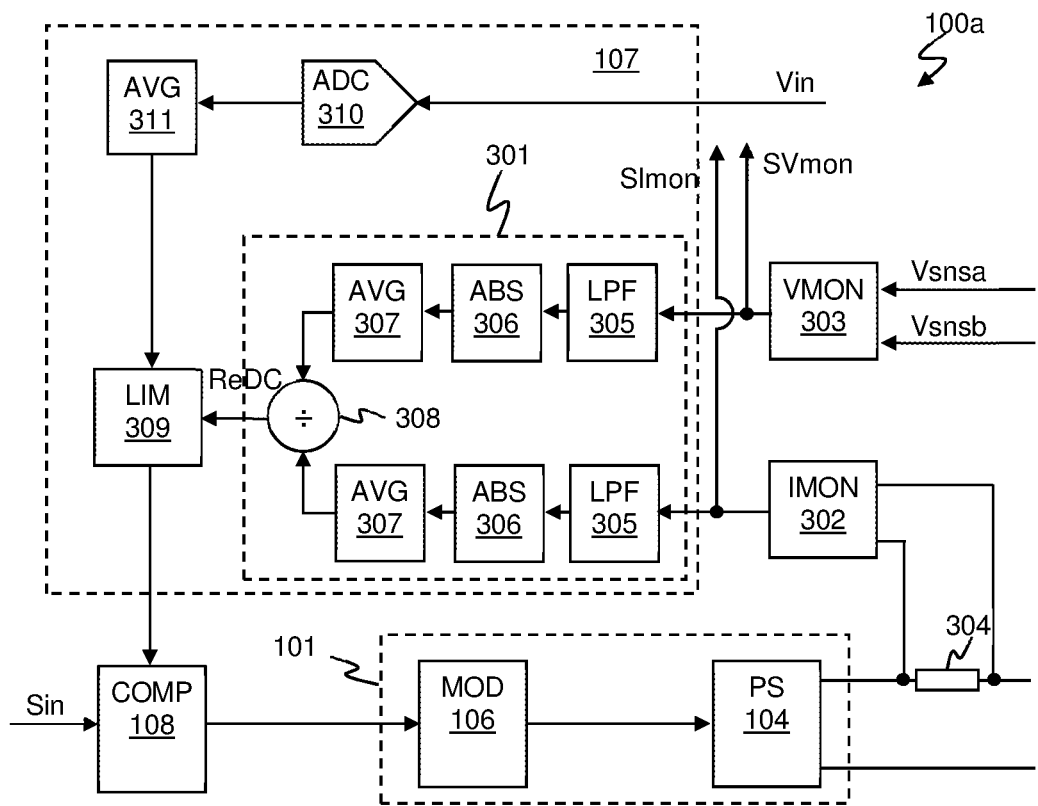
FIG. 3 illustrates a switching driver with one example of a clipping prevention controller that takes load resistance and input voltage into account.

FIG. 3 illustrates a switching driver apparatus 100a with one example of a clipping prevention controller 107. FIG. 3 again illustrates an audio path comprising a compressor 108 upstream of a switching driver 101 having a modulator 106 and power stage 104 for driving a load transducer (not illustrated in FIG. 3). The compressor 108 is controlled by the clipping prevention controller 107 and, in this example, the clipping prevention controller 107 sets one or more limiting thresholds at which the compressor 108 acts to apply compression.

In this example, the clipping prevention controller 107 comprises a load resistance monitor 301 for determining a DC resistance ReDC of the load. There are various ways in which a DC load resistance could be determined, as will be understood by one skilled in the art, and FIG. 3 illustrates just one example. The load resistance monitor 301 receives from current monitoring circuitry 302 and voltage monitoring circuitry 303 respectively, indications Simon and SVmon of the output current and voltage. The current monitoring circuitry 301 is configured to monitor an output current from the power stage 104 to the load transducer, for instance by monitoring the voltage across a sense resistor 304 in at least one of the output paths, although any suitable means for monitoring the load current may be implemented. The current monitoring circuitry 302 may comprise an analog front end and ADC (not separately illustrated) as will be understood by one skilled in the art. The voltage monitoring circuitry 303, which may similarly comprise an analogue front end and ADC (not separately illustrated), is configured to monitor voltages Vsnsa and Vsnsb on either side of the load, e.g. the output voltages at the output nodes 103a and 103b respectively.

It will be noted that in many conventional implementations of a switching driver it may generally be desirable to monitor the output current and voltage and the current and voltage monitoring circuitry 302 and 303 may thus typically be present in a conventional switching driver circuit. The current and voltage monitoring circuitry 302 and 303 may therefore be shared with other control functions and may not represent any additional circuit overhead in terms of area or bill of materials for the clipping prevention controller 107.

In the example of FIG. 3, the load resistance monitor 301 is configured such that, for each of the received current and voltage signals, Simon and SVmon, the relevant signal is filtered by a respective low pass filter 305, processed by absolute value block 306 and averaged by moving average 307 to provide the average or DC peak magnitude or envelope value of the current and voltage respectively. These DC values are divided by divider 308 to provide an indication of the real-time DC resistance of the load, ReDC.

This determined DC resistance of the load transducer is provided to a limiter 309. In the example of FIG. 3, the limiter 309 also receives an indication of the input voltage Vin, which may, in some cases, be a value provided by ADC 310, configured to monitor the input voltage, and averaged by moving averager 311. The limiter 309 is configured to set one or more limits for the compressor 108 based on the determined DC load resistance ReDC and indication of input voltage Vin. In some cases the limiter 309 may comprise a look-up-table of predetermined limiting thresholds based on the values of Vin and ReDC, which correspond to suitable limits for the input signal to avoid the voltage demand exceeding the maximum achievable output voltage. The limiter 309 may be configured to control a hard limit and at least one soft limit for the compressor 108. The compressor 108 may be configured to apply compression so that no signal peak of the compressed input signal exceeds the hard limit. The soft limit may be a limit which is lower than the hard limit at which the compressor starts to apply compression so as to provide a more gradual application of compression which can be better for distortion performance. As the hard and soft limits are dynamically adjusted in use, based on Vin and ReDC, limiting may be applied based on the current operating conditions, rather than an assumed worst case, which can improve performance, in that the limiting thresholds can be set closer to the actual point at which clipping would occur.

It will be understood that the determination of real-time DC resistance of the load, ReDC, does require an indication of current and voltage to be available. This can be performed during output of an output signal, e.g. during audio playback, although in some cases it may be preferable to only determine a value of load resistance if the current and voltage signals are above certain value limits, so as to limit the impact of measurement errors. Therefore, in some examples, the clipping prevention controller 107 may be configured to only process the ReDC value and/or update the compressor limits when the relevant measurement signals are above defined limits. The DC load resistance will typically vary only relatively slowly, for instance on timescales of the order of hundreds of milliseconds or so, and updating the compressor limits only when there are periods of significant signal can thus be acceptable. The DC load resistance will not change much during short periods of low signal and clipping prevention will not be needed if the signal is at a continuous low level. However, in some embodiments a subsonic or out of band tone could be inserted into the signal in the audio path when the switching driver is active so as to allow for continuous monitoring of the load resistance. In either case, the measurement and processing of the current and voltage signals Simon and SVmon for clipping prevention can be relatively low latency and/or need not be of very high accuracy.

The embodiment of FIG. 3 can thus provide dynamic adjustment of limiting thresholds for clipping prevention based on an indication of the actual maximum voltage which is achievable, given the present operating conditions and thus can reduce the extent of over-limiting, i.e. applying a greater amount of limiting to the signal than is required. The embodiment of FIG. 3 takes input voltage Vin and DC load resistance into account in a relatively simple and easy to implement circuit that may make use of circuit blocks that would, in any case, likely be present, e.g. the current and voltage monitoring circuitry. However, the embodiment of FIG. 3 still requires some margining built into the relevant limits, e.g. to account for the effect of temperature on the operation of the power stage 104, the effects of capacitor aging on the capacitive voltage generators etc.

In some implementations, the clipping prevention may take a set of one or more additional variables into account so as to improve clipping performance, i.e. to allow output voltage levels to be realised up to, but not beyond, the point of signal clipping.

Referring back to equation 1, it will be seen that the output voltage depends not only on the input voltage Vin and the load resistance Rload, but also on the effective output resistance Rout of the power stage 104 and, of course, the signal Smod which sets the duty cycle. Smod and Rout act in concert to define the maximum signal that can be faithfully represented on the output before clipping occurs. The signal Smod represents the voltage demand of the power stage 104 and increasing the value of Smod can increase the output power demand, but at the cost of efficiency at high output voltage levels.

For any given input voltage Vin and load resistance Rload, it is possible to determine the maximum possible output voltage Voutmax that may be achievable given how Smod and Rout vary. In other words, the value of the related variables Smod and Rout that lead to the maximum output voltage Voutmax can be determined. Thus, for a given input voltage Vin and load resistance Rload, a predicted maximum output voltage, Voutmax, can be determined as:

$$Voutmax = (Smodmax \cdot Vin)/(Routmax/Rload + 1) \qquad \text{Eqn. 2}$$

where Smodmax and Routmax are the determined values of Smod and Rout that lead to the maximum output voltage. The predicted maximum output voltage, Voutmax, can then be used to set appropriate limits to apply compression to the input signal (and/or apply any other gain control or limiting).

In a switching driver 101 such as discussed with reference to FIG. 1, a range of variables such as temperature (of the switching driver circuit, e.g. IC temperature) and process variations can impact on the values of Smod and Rout that lead to the predicted maximum output voltage, Voutmax, and clearly input voltage Vin and load resistance Rload also have an impact. However, a solution space can be predetermined based on the possible variations in the relevant variables to allow a set of Smodmax and Routmax values to be determined that maximize output voltage levels up to but not beyond the point of clipping. In use, the various dependent variables can be determined, e.g. through monitoring and/or prediction and used to determine appropriate limits for applying compression that correspond to the relevant Voutmax value.

Figure 4:
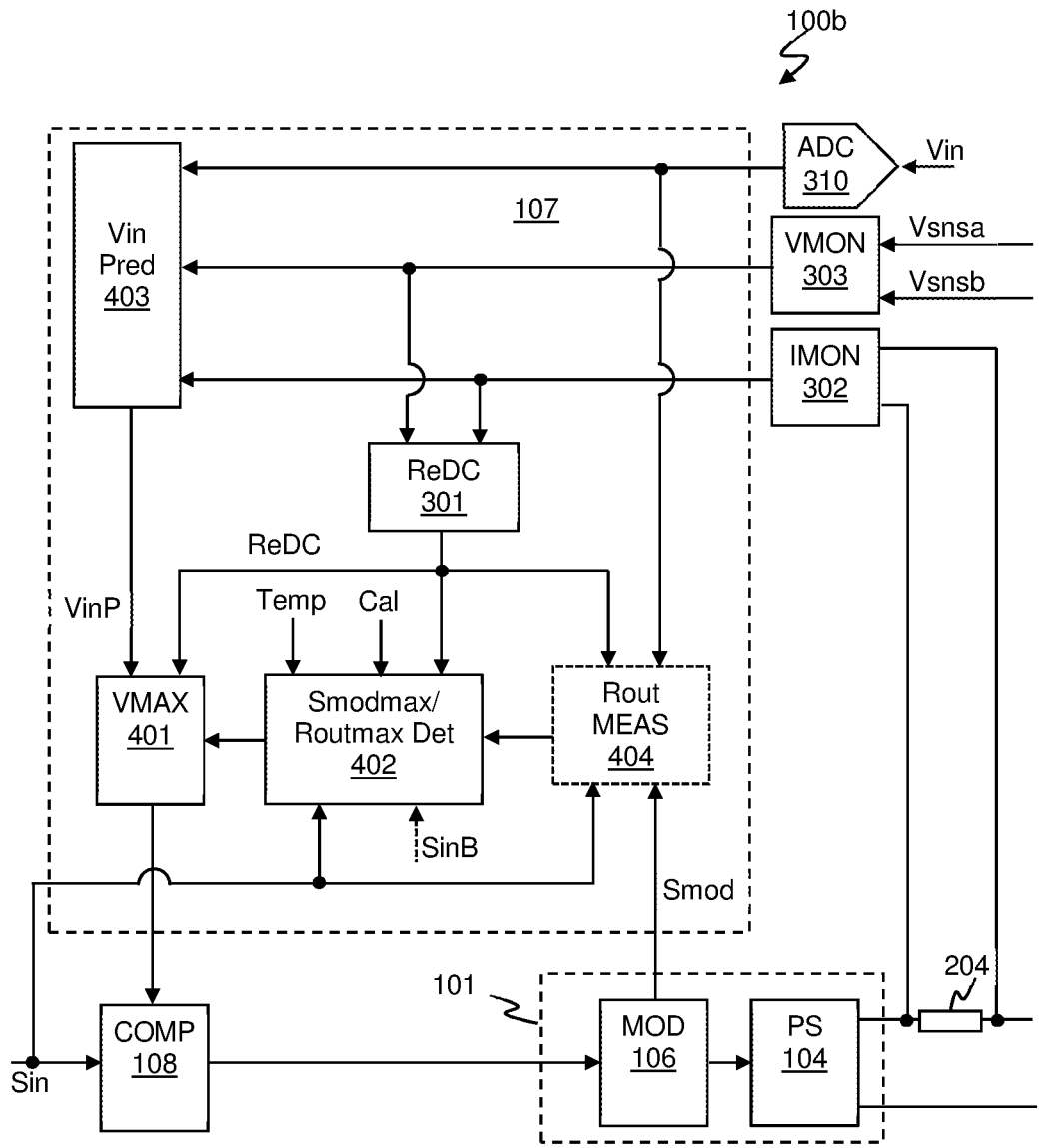
FIG. 4 illustrates a switching driver with one example of a clipping prevention controller that also takes variables impacting driver efficiency into account.

FIG. 4 illustrates a switching driver apparatus 100*b* with another example of a clipping prevention controller 107 according to an embodiment. Again FIG. 4 illustrates an audio path comprising a compressor 108 and a switching driver 101 having a modulator 106 and power stage 104 for driving a load transducer (not illustrated in FIG. 3). Again the compressor 108 is controlled by the clipping prevention controller 107 and, in this example, the clipping prevention controller 107 sets limits at which the compressor 108 acts to apply compression.

In this example, however, the clipping prevention controller 107 has a limiter 401 configured to determine a maximum voltage value corresponding to a maximum output voltage for the switching driver 101 so as to set one or more limits, e.g. hard and soft limits, of compressor 108. In this example, the limiter 401 receives an indication of optimal values of Smod and Rout that would lead to the maximum possible output voltage without clipping, which are determined by Smodmax/Routmax determination block 402. The limiter 401 also receives an indication of the input voltage Vin and the load resistance Rload and may determine the maximum output voltage according to equation 2 above.

The load resistance Rload may be determined as the DC load resistance and the clipping prevention controller 107 may thus comprise a load resistance monitor 301 such as discussed with reference to FIG. 3, that receives indications Simon and SVmon of output current and voltage respectively from current monitoring circuitry 302 and voltage monitoring circuitry 303 and determines DC load resistance ReDC. In some embodiments, however, the load resistance could advantageously be determined in a predictive manner, for instance using a system-identification algorithm, based on the indications SImon and SVmon of output current and voltage and thus the load resistance monitor 301 could comprise a load resistance predictor.

The indication of input voltage Vin may be determined by monitoring the input voltage Vin in a similar manner as discussed with reference to FIG. 3, but in the example of FIG. 4, a prediction of the input voltage VinP is determined by input voltage predictor 403. The predictor 403 receives the monitored level of the input voltage Vin and, in the example of FIG. 4, also the monitored indications of output current and voltage Simon and SVmon and generates a prediction VinP of the input voltage Vin, although other examples may use additional or alternative variables, e.g. such as the input signal, as part of the prediction. One skilled in the art will be aware of various ways in which the input voltage may be predicted, and it is noted that input voltage prediction has previously been proposed for some transducer driver circuits for other control purposes.

In the example of FIG. 4, the values of Smodmax and Routmax, i.e. the optimal values that maximize the output voltage without clipping, are determined based on set of variables including, in this example, a temperature signal Temp, calibration values for components of the switching driver Cal, the determination of load resistance ReDC and the input signal Sin.

The temperature signal Temp is an indication of the temperature of the switching driver 101 and may, for instance, be a reactively monitored temperature of the integrated circuit.

The calibration values, Cal, may be an indication of any variation of the components of the switching driver 101 from nominal design values, e.g. such an indication of trimming values for accounting for process variations. The calibration values may be determined in a calibration process, which may, for instance, be an initial calibration as part of circuit fabrication and testing and the relevant trim values may, for instance, be stored in some suitable memory. In some cases there may be periodic further calibration to adjust and/or add calibration values, e.g. to account for aging.

The load resistance may, as discussed above, be a monitored value of DC load resistance but may, advantageously in some implementations, be a predicted value of load resistance.

The input signal Sin may be received and, in some case, used to provide a prediction of the input signal.

The determination block 402 is configured, given the value of the set of variables which are monitored or predicted (as appropriate), to determine first and second determined values corresponding to a value of quantizer input signal, Smodmax and a value of output resistance of the switching driver, Routmax, respectively which collectively maximise the output voltage. Conveniently these optimal values of Smodmax and Routmax may be predetermined for the whole solution space defined by the possible input ranges of the set of dependent variables and stored in a suitable memory, e.g. a look-up table or the like. The predetermined values of Smodmax and Routmax can be determined by suitable modelling and/or calculation for a given switching driver 101, with simulation and/or testing, as would be understood by one skilled in the art.

Given the relevant dependent variables, the determination block 402 may thus simply identify the relevant optimal values and provide these values of Smodmax and Routmax to the limiter 401. In some implementations, however, the values of the dependent variables could be input to a suitable model or algorithm to determine the optimal values Smodmax and Routmax and/or there could be some interpolation based on predetermined stored values.

In some implementations, there may be other factors that may impact on efficiency of the switching driver 101 which may be taken into account. For instance, in some applications the switching driver 101 may be part of a multi-channel driver apparatus for driving different load transducers in different channels, e.g. for stereo or multi-channel audio, and at least some of the components of the switching driver 101 may be shared with a switching driver of another channel. As an example, at least one of the capacitive voltage generators 106-1 or 106-2 discussed with reference to FIG. 1 may also be used to provide switching voltages to a power stage for another channel. In this case both channels may, in use, draw current from the relevant capacitive voltage generator 106, which can have an effect on conduction losses of a shared conduction path. Thus, the level of a signal being output by a power stage of a switching driver of another channel may have an impact on the efficiency of the switching driver 101 of this channel. In the embodiment of FIG. 4 the Smodmax/Routmax determination block 402 may thus receive an indication of a signal level for another relevant channel, e.g. a version of the input signal SinB for that channel, and take the signal level of the relevant other channel(s) into account in determining values of Smodmax and Routmax to be applied.

The limiter 401 receives the values of Smodmax and Routmax and, using the load resistance ReDC and prediction of input voltage VinP, determines the predicted maximum achievable output voltage and sets one or more limiting thresholds for the compressor 108, e.g. hard and soft limits, based on the determined maximum voltage level.

It should be understood that the functional blocks 402 for determining the values Smodmax and Routmax and 401 for determining Voutmax and the appropriate limiting thresholds are illustrated separately for clarity of explanation, but these functions could be combined into a single functional block that receives the set of dependent variables and determines the appropriate limiting thresholds. It should also be understood that operation has been described in terms of determining Smodmax and Routmax and then determining Voutmax to explain the principles of how the relevant limiting thresholds are calculated. In some implementations at least some of these values may not explicitly determined as such, for instance values could be determined which are related to Routmax and Smodmax and which can be used to set an appropriate limiting threshold for clipping protection. The functional blocks 401 and 402 may be implemented at least partly by software, e.g. as firmware for the switching driver apparatus, although in some cases at least some of the functionality may be provided by suitable hardware.

The embodiment of FIG. 4 thus includes parameters that impact the efficiency of the switching driver 101 into account into setting appropriate limiting thresholds for clipping protection. This can improve performance in reducing over-limiting of the input signal. The embodiment of FIG. 4 may, as discussed, use a prediction of at least some of the variables. A predictive approach can be beneficial in that limiting can be applied only when needed and soft limiting can be more readily applied so as to prevent the need for hard limiting to be applied, as hard limiting may result in a greater amount of distortion.

In some implementations there may additionally be some reactive monitoring to help in the event of any unexpected clipping, i.e. if the predictive approach does not fully prevent clipping. In other words there may be a "clip-and-fix" backup to the predictive monitoring. FIG. 4 illustrates that a Smod/Rout measurement block 404 may monitor the real-time value of the effective output resistance Rout of the switching driver 101 and the value of the quantizer input signal Smod. For a modulator 106 such as discussed with reference to FIG. 2, where the signal Smod input to the quantizer controller 202 is a digital signal, a version of this digital signal may simply be supplied to the Smod/Rout measurement block 404.

In the example of FIG. 4, the Smod/Rout measurement block 404 monitors the input signal Sin, input voltage Vin, load resistance ReDC and quantizer input signal Smod and adjusts the compressor limits to try to avoid clipping. Should the a-priori calculation be off, such that an unexpected clip condition occurs, the real-time quantizer input signal Smod and real-time computed effective output resistance Rout can be used by the Smodmax/Routmax determination block 402 to proportionately scale the utilized Smodmax and Routmax values. This can be applied on a configurable fast-attack, very slow-release basis. Additionally or alternatively, in the event of any unexpected clipping the Smodmax and Routmax values retrieved from memory, e.g. the values stored in a LUT, may be compared to the real-time monitored data and if a difference between the values exceeds a predefined threshold, the stored values can be faded towards the measured data, i.e. the stored values may be updated based on actual clipping events to prevent future clipping. An unexpected clipping event may be detected in numerous ways, for instance by detecting one or more of: clipping of integrator in the loop filter, reaching a current limit or reaching the maximum allowed Quantizer input to the modulator is reached. In general, therefore, the output of the Smod/Rout measurement block 404 may be used by the Smodmax/Routmax determination block 402 to optimise the relevant Smodmax and Routmax values.

The embodiment of FIG. 4 thus dynamically adjusts the limiting thresholds at which clipping prevention is applied, in this example the limits for engaging compressor 108, based on the input voltage Vin and load resistance Rload but also based on a set of variables that impact on the efficiency of the switching driver 101. Taking the efficiency of the switching driver 101 into account in this way allow the limits to be set appropriately based on the operating conditions to avoid over-limiting and thus allow a greater use of the full possible range of output voltages.

As noted above, the embodiment of FIG. 4 may effectively predict the variables that impact efficiency so as to improve performance. However, for closed loop operation of the switching driver 101, i.e. where the modulator 106 of the switching driver receives a feedback signal of the output voltage Vout across the load, such as discussed with reference to FIG. 2, it will be noted that the quantizer input signal Smod, which is generated based on the input signal Sin and the feedback signal, effectively includes the effects of the switching driver efficiency. One skilled in the art will understand that quantizer input signal Smod, which as discussed with reference to FIG. 2 can include an error component of the error between the input signal Sin and feedback signal Sfb, effectively varies the voltage demand of the switching driver 101 based on the input signal and the performance of the switching driver so as to provide the required output signal.

In some embodiments therefore the clipping prevention controller may be based on monitoring the quantizer input signal Smod against a maximum limit, which may be a programmable limit that can be predetermined for a particular switching driver apparatus.

Figure 5:
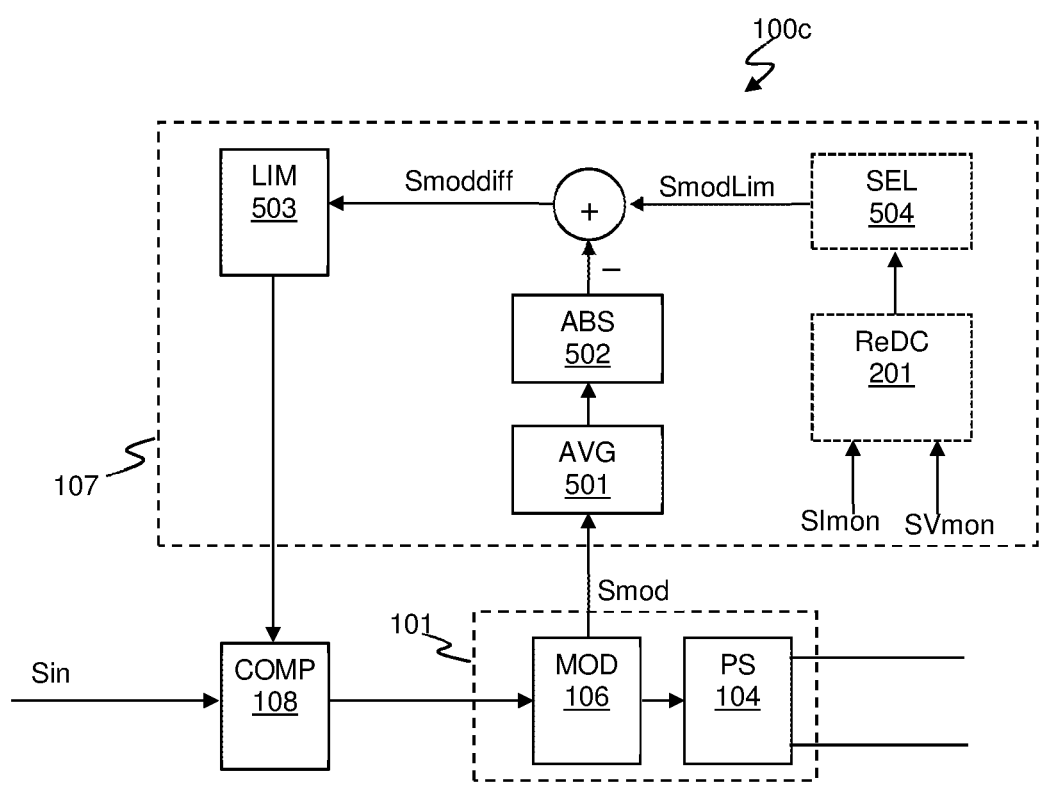
FIG. 5 illustrates a switching driver with another example of a clipping prevention controller that controls clipping based on an input to a quantizer of the modulator.

FIG. 5 illustrates another switching driver apparatus 100c with a further example of a clipping prevention controller 107, which again illustrates an audio path comprising a compressor 108 and a switching driver 101 having a modulator 106 and power stage 104 for driving a load transducer (not illustrated in FIG. 5). Again the compressor 108 is controlled by the clipping prevention controller 107 and, in this example, the clipping prevention controller 107 sets limits at which the compressor 108 acts to apply compression.

In the example of FIG. 5, the switching driver 101 is configured for closed-loop operation (i.e. so that modulator 106 uses a feedback signal Sfb as discussed with reference to FIG. 2) and the clipping prevention controller 107 is configured to determine a difference between a monitored value of the signal Smod input to the quantizer/controller 202 of the modulator 106 and a predetermined maximum limit, SmodLim, for the quantizer input signal. The Smod signal may be taken from the modulator 106 and, as discussed above with reference to FIG. 2, the modulator 106 may advantageously be implemented so that the quantizer input signal Smod is a digital signal. In which case, the digital signal Smod may be tapped from the modulator 106, averaged by averager 501 and processed by absolute value block 502 to provide an indication of the present envelope or peak magnitude value of the Smod signal. Thus the monitored value of the signal Smod may be an envelope or peak magnitude value. However, in some implementations, Smod may be an analog signal which may be digitized by a suitable ADC and processed in a similar fashion. The envelope or peak magnitude value of Smod can be subtracted from the maximum limit value SmodLim to provide a difference signal Smoddiff. The maximum limit value SmodLim may, in some cases be a predetermined value that is stored in a suitable memory. The limiter 503 receives the difference signal Smoddiff and dynamically sets one or more limiting thresholds of the compressor 108, e.g. hard and soft limits, based on the difference value. The limiter 503, may, for instance, comprise a PI (proportional-integrator) controller as would be understood by one skilled in the art.

The limiter 503 operates so as to control the limiting threshold(s) based on the difference between the monitored value of the quantizer input signal Smod and the defined limit SmodLim, i.e. based on how close the current value of Smod is to the limit. If there is a relatively large difference between the monitored value of the Smod signal and the limit SmodLim, the PI controller of the limiter 503 may provide a relatively high output, resulting in a relatively high limit for the compressor 108 before compression is applied. However, if the difference reduces, indicating the monitored value of Smod is getting closer to the limit, the output of the PI controller of the limiter 503 will change accordingly, with a consequential reduction of the limit(s) at which compression is applied. In this way the limits applied by the compressor 108 to the input signal Sin will be dynamically adjusted, so as to apply limiting when appropriate to prevent the modulator signal Smod from exceeding the limit SmodLim.

The limiter 503 may be configured to change the limit(s) relatively quickly as the difference signal Smoddiff reduces (i.e. as the monitored value of Smod gets close to the limit) to prevent clipping. The limiter 503 may also be configured to release (i.e. increase) the limits as the difference signal Smoddiff increases with a suitable trade-off between minimal over-limiting and distortion performance. The PI controller of the limiter 503 may thus be tuned with suitable attack and release time constants. In some cases the PI controller may be configured so as to only operate to vary the limits applied when the difference Smoddiff between the monitored value of the signal Smod and the limit SmodLim is smaller than a certain amount, and/or when the compressor is actively applying compression.

Whilst a PI controller is one advantageous way to implement the limiter 503, in other examples the limiter 503 could be configured to use a linear or logarithmic scalar of the difference value (Smoddiff) to adjust the limits of the compressor or apply some other gain limiting to the input to the switching driver 101.

In some examples the limit SmodLim may be a fixed limit, but in some implementations the clipping prevention controller may be selectively varied based on an indication of load resistance. Thus, for instance, the clipping prevention controller 107 could comprise a DC load resistance monitor, such as discussed above with reference to FIG. 3, and the limit SmodLim may be selectively scaled by limit selector 504 as a function of load resistance. This can allow the limit SmodLim for the quantizer input to be pushed closer to the actually maximum for the switching driver 101 and realise a higher output voltage.

The examples discussed herein thus provide dynamic adjustment of limits used for limiting the input signal for a switching driver which thus reduces unwanted limiting and consequential impact of distortion and maximises the ability of the switching driver to provide output signals up to, but not exceeding the point of clipping.

The examples described above with reference to the figures envisage setting one or more limits for a compressor in the data path upstream of the switching driver. However other methods/components for limiting the input signal could be used in other implementations.

The examples above have been discussed in the context of driving a transducer, which may in particular be an audio transducer, and embodiments of the present disclosure may advantageously be used in audio application or other applications for driving a transducer, e.g. such as haptic output transducer. However, the clipping prevention control may be applied to any application in which a switching driver is used to output an output voltage to a load based on an input signal, in particular a switching driver in which at least one voltage that may be used as a switching voltage is generated by a capacitive voltage generator.

The driver apparatus of embodiments of the disclosure may be suitable for driving an output transducer. The output transducer may be, in some implementations, be an audio output transducer such as a loudspeaker or the like. The output transducer may be a haptic output transducer. In some implementation the output transducer may be driven in series with an inductor, i.e. there may be an inductor in an output path between an output node of the switching driver and the load. In some implementations the transducer may be a piezoelectric or ceramic transducer.

Embodiments may be implemented as an integrated circuit. Embodiments may be implemented in a host device, especially a portable and/or battery powered host device such as a mobile computing device for example a laptop, notebook or tablet computer, or a mobile communication device such as a mobile telephone, for example a smartphone. The device could be a wearable device such as a smartwatch. The host device could be a games console, a remote-control device, a home automation controller or a domestic appliance, a toy, a machine such as a robot, an audio player, a video player. It will be understood that embodiments may be implemented as part of a system provided in a home appliance or in a vehicle or interactive display. There is further provided a host device incorporating the above-described embodiments.

The skilled person will recognise that some aspects of the above-described apparatus and methods, for instance for prediction of variables or setting of limits, may be embodied as processor control code, for example on a non-volatile carrier medium such as a disk, CD- or DVD-ROM, programmed memory such as read only memory (Firmware), or on a data carrier such as an optical or electrical signal carrier. For some applications, embodiments may be implemented on a DSP (Digital Signal Processor), ASIC (Application Specific Integrated Circuit) or FPGA (Field Programmable Gate Array). Thus, the code may comprise conventional program code or microcode or, for example code for setting up or controlling an ASIC or FPGA. The code may also comprise code for dynamically configuring re-configurable apparatus such as re-programmable logic gate arrays. Similarly, the code may comprise code for a hardware description language such as Verilog™ or VHDL (Very high-speed integrated circuit Hardware Description Language). As the skilled person will appreciate, the code may be distributed between a plurality of coupled components in communication with one another. Where appropriate, the embodiments may also be implemented using code running on a field-(re) programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. A driver apparatus for driving a transducer based on an input signal comprising:
   a switching driver comprising first and second input nodes for receiving first and second supply voltages defining an input voltage and first and second output nodes for connection to the transducer, the switching driver being configured to switch one or both of the first and second output nodes between different switching voltages with a controlled duty-cycle to drive an output signal across the transducer; and
   a clipping prevention controller configured to control a gain applied to the input signal so as to provide limiting of the input signal to avoid clipping of the output signal, wherein the clipping prevention controller is configured to dynamically control at least one limiting threshold used to determine when to apply limiting of the input signal based on an indication of load resistance of the transducer and the input voltage to the switching driver.

2. The driver apparatus of claim 1 comprising at least one capacitive voltage generator for generating an additional voltage, wherein the switching driver is configured, in at least one mode of operation, to use the additional voltage as a switching voltage.

3. The driver apparatus of claim 1 wherein the switching driver comprises a switch network and a modulator configured to receive the input signal and control the switch network so as to switch said one or both of the first and second output nodes between different switching voltages with a controlled duty-cycle, wherein the modulator comprises a quantizer controller configured to receive a quantizer input signal based on the input signal and to output switch control signals for controlling the duty-cycle of one or more switches of the switch network.

4. The driver apparatus of claim 3 wherein the clipping prevention controller comprises a limiter configured to determine a maximum voltage value corresponding to a maximum output voltage for the switching driver based on the indication of input voltage and the indication of load resistance of the transducer and also based on first and second values corresponding to a value of quantizer input signal and a value of output resistance of the switching driver respectively which collectively maximise the output voltage, wherein the limiter is configured to control the at least one limiting threshold based on said maximum voltage value.

5. The driver apparatus of claim 4 wherein the clipping prevention controller comprises a determination block configured to determine said first and second determined values based on a set of variables, wherein said set of variables comprises at least one of: temperature of the switching driver; calibration values for components of the switching driver; input signal level; the indication of load resistance; a signal level of a signal in another channel of the driver apparatus for driving a different transducer.

6. The driver apparatus of claim 5 wherein the determination block comprises a memory storing predetermined first and second values for each of a plurality of different possible combinations of values of the set of variables, and wherein the determination block is configured to receive or determine values of the set of variables and identify an appropriate one of the predetermined first and second values.

7. The driver apparatus of claim 6 wherein the clipping prevention controller further comprises an output resistance and quantizer input monitor configured to determine a monitored value of output resistance of the switching driver and determine a monitored value of the magnitude of quantizer input signal and wherein the determination block is configured, in the event of occurrence of signal clipping, to adjust the predetermined first and second values based on the monitored value of output resistance and monitored value of the quantizer input signal.

8. The driver apparatus of claim 7 wherein the modulator is configured such that the quantizer input signal is a digital signal.

9. The driver apparatus of claim 1 wherein the clipping prevention controller comprises an input voltage predictor for providing a prediction of input voltage and the clipping prevention controller is configured to use the prediction of input voltage as said indication of input voltage.

10. The driver apparatus of claim 9 wherein the voltage predictor is configured to receive, and predict the input voltage from, a measurement of the input voltage, an indication of output current from the switching driver to the transducer and an indication of output voltage across the transducer.

11. The driver apparatus of claim 1 wherein the clipping prevention controller comprises a load resistance predictor for providing a prediction of load resistance and the clipping prevention controller is configured to use the prediction of load resistance as said indication of load resistance.

12. The driver apparatus of claim 11 wherein the load resistance predictor is configured to receive, and predict the load resistance from, an indication of output current from the switching driver to the transducer and an indication of output voltage across the transducer.

13. The driver apparatus of claim 1 wherein the clipping prevention controller comprises a load resistance monitor configured to determine a DC resistance of the transducer based on an indication of output current from the switching driver to the transducer and an indication of output voltage across the transducer and the clipping prevention controller is configured to use the determined DC resistance of the transducer as said indication of load resistance.

14. The driver apparatus of claim 1 wherein the clipping prevention controller comprises a store of predetermined threshold limits for possible values of determined DC resistance and input voltage.

15. The driver apparatus of claim 1 wherein said at least one limiting threshold is a threshold for a compressor in a signal path for the input signal upstream of the switching driver.

16. The driver apparatus of claim 15 wherein said at least one limiting threshold comprises a soft limit threshold and a hard limit threshold, wherein the compressor is configured to start to apply compression to the input signal at the soft limit threshold and is configured to apply compression so that the input signal, after compression, does not exceed the hard limit threshold.

17. The driver apparatus of claim 1 wherein the switching driver is configured to be operable in a plurality of operating modes, wherein the switching voltages are different in the different modes.

18. A driver apparatus for driving a load based on an input signal comprising:
a switching driver; and
a clipping prevention controller configured to control a gain applied to the input signal so as to provide limiting of the input signal to avoid clipping of the output signal, wherein the clipping prevention controller is configured to dynamically control at least one limiting threshold used to determine when to apply limiting of the input signal based on each of:
an indication of load resistance of the transducer;
an indication of an input voltage to the switching driver; and
a set of one or more variables that affect efficiency of the switching driver.

19. The driver apparatus of claim 18 wherein the indication of load resistance is a prediction of load resistance determined by a load resistance predictor and the indication of input voltage is a prediction of input voltage determined by an input voltage predictor.

20. A driver apparatus for driving a load based on an input signal comprising:
a switching driver; and
a clipping prevention controller configured to dynamically control at least one limiting threshold used to determine when to apply limiting of the input signal based on a prediction of load resistance of the transducer and a prediction of an input voltage to the switching driver.

* * * * *